United States Patent [19]
Lipp

[11] Patent Number: 5,371,457
[45] Date of Patent: Dec. 6, 1994

[54] METHOD AND APPARATUS TO TEST FOR CURRENT IN AN INTEGRATED CIRCUIT

[76] Inventor: Robert J. Lipp, 15881 Rose Ave., Los Gatos, Calif. 95030

[21] Appl. No.: 679,457

[22] Filed: Apr. 2, 1991

Related U.S. Application Data

[63] Continuation-in-part of Ser. No. 655,516, Feb. 12, 1991, abandoned.

[51] Int. Cl.$^5$ .............................................. G01R 27/02
[52] U.S. Cl. .................... 324/158.1; 324/73.1
[58] Field of Search .............. 324/158 R, 73.1, 501, 324/537; 371/22.4, 22.6, 15.1, 16; 437/8; 307/303.1

[56] References Cited

U.S. PATENT DOCUMENTS

| | | | |
|---|---|---|---|
| 4,743,841 | 5/1988 | Takeuchi | 324/158 R |
| 4,801,867 | 1/1989 | Suzuki | 324/158 R |
| 4,853,628 | 8/1989 | Gouldsberry et al. | 324/158 R |
| 4,894,605 | 1/1990 | Ringleb et al. | 324/158 R |

OTHER PUBLICATIONS

Jerry M. Soden et al., "Zero Defects or Zero Stuck-At Faults-CMOS IC Process Improvement with I$_{DDQ}$," 1990 International Test Conference, pp. 255–256.

Steven McEuen, "Why IDDQ?", 1990 International Test Conference, p. 252.

Wojciech Maly et al., "Testing Oriented Analysis of CMOS ICs with Opens," pp. 344–347.

Mike Keating et al., "A New Approach to Dynamic IDD Testing," 1987 International Test Conference, pp. 316–320.

*Primary Examiner*—Vinh Nguyen
*Attorney, Agent, or Firm*—Skjerven, Morrill, MacPherson, Franklin & Friel

[57] ABSTRACT

Various methods and apparatus perform IDDQ testing using the input and output circuits typically associated with input and output pads of an integrated circuit. Under these methods, the number of tester channels and external circuit elements required for IDDQ measurements is minimized. In one embodiment, the IDDQ current is measured by sensing the voltage at either an input pad or an output pad. In another embodiment, an internal pull-up transistor of known resistance is used for current sensing. In another embodiment, a method and apparatus for performing IDDQ testing quickly are provided by disconnecting the primary power or ground bus line connections from the tester and using alternate connections to provide power to the circuit under test over the duration of the IDDQ testing.

41 Claims, 6 Drawing Sheets

METHOD AND APPARATUS TO TEST FOR CURRENT IN AN INTEGRATED CIRCUIT

This application is a continuation-in-part of a copending application Ser. No. 07/655,516 entitled "Method and Apparatus to Test for Current in an Integrated Circuit," by Robert J. Lipp, filed on Feb. 12, 1991, now abandoned.

FIELD OF THE INVENTION

This invention relates to the testing of integrated circuits. In particular, this invention relates to measuring currents of an integrated circuit.

BACKGROUND OF THE INVENTION

Due to improper manufacturing, integrated circuits (ICs) are subject to a variety of failure modes. Therefore, each IC must be tested to identify any defective circuits before assembly and shipment. However, both the complexity and the cost of testing an IC are growing rapidly, since ICs having over 100,000 logic gates and 256 pins are now common. At present, there is no sign that this rapid growth rate in complexity will abate.

Even though many techniques and software tools are becoming available to increase design productivity, test productivity lags far behind. Poor test productivity means that the design cycle may soon be dominated by the testing activities. In addition, the complexity of the IC requires both expensive testers (i.e. those costing in excess of a million dollars), and longer test throughput times, thereby driving test costs even higher. In response to this development, and aiming at improving test productivity and reducing test costs, the "IDDQ testing" technique is developed. Benefits of IDDQ testing are discussed in "Zero Defects or Zero Stuck-At Faults—CMOS IC Process Improvements with IDDQ", by J. Soden et al, Proc. Int'l Test Conf., 1990, pp. 255–56 and "Why IDDQ", by S. McEuen, Proc. Int'l Test Conf., 1990, p. 252.

In IDDQ testing, the amount of current (IDD) the IC draws is measured on many, possibly all, test patterns applied to it. Each such measurement is made when the IC is in its quiescent state, i.e. after the circuit has had time to stabilize after switching. These test patterns may exceed tens of thousands of test vectors. IDDQ testing assumes that many IC manufacturing defects cause IDD to be abnormally high. One example is where two circuit nodes are shorted. IDDQ testing is also applicable for detecting many other defects, even open-circuit signal lines in CMOS, as noted in "Testing Oriented Analysis of CMOS ICs With Opens", by W. Maly et al., Proc. Int'l Conference on Computer Aided Design, 1988, pp. 344–47.

IDDQ testing is particularly applicable to circuits of CMOS, BiCMOS and other technologies that have low quiescent current. The circuits of these technologies may have a relatively high current requirement during switching, but typically have a low quiescent current after the circuit stabilizes. Since a defective circuit may cause the current drawn to increase by orders of magnitude from the normal quiescent current, IDDQ testing differentiates such defective circuits from the good circuits. However, the time required for IDDQ testing using this approach is impractical because parametric measurement units (PMUs) in conventional testers cannot provide quickly enough the many accurate current measurements demanded by IDDQ testing. For example, each IDDQ measurement may take from one to ten milliseconds. That is, if 20,000 test vectors are applied, the test time required to complete the test will be between 20 and 200 seconds, which is much too long to be practical for production testing purpose. Hence, specially designed circuits and current probes external to the IC under test have been provided in order to improve throughput time of the IDDQ test. Such techniques are reviewed in "A New Approach to Dynamic IDD Testing", by M. Keating and D. Meyer, Proc. Int'l Test Conf., 1987, pp. 316–21. However, this review did not propose integrating these circuits into the IC. In fact, for the circuits shown therein, both the need for large decoupling capacitors and the high impedance such circuits necessarily add to the ground and power bus lines of the IC make it difficult, if not impossible, to integrate such circuits on-chip without impacting the IC's performance in its target application.

FIGS. 1 and 2 are used to illustrate the IDDQ measurements described above. FIG. 1 is a simplified schematic of an IC 1 showing connection pads 2 and 3 for power (VDD), and connection pads 4 and 5 for ground (VSS). In the following description, the pads, such as 2 and 5, which are connected to the power supply during normal operation are designated "primary power supply pads." Also shown are input pads 6 and 10 and output pads 7 and 16. Output pad 16 is driven by output inverting buffer 17, which is in turn driven at its input lead by the circuit-under-test (CUT) 13. Output pad 16 is connected by a pull-up resistor 18 to the VDD supply. This pull-up resistor 18 is especially useful if inverting buffer 17 can assume a high-impedance state. Output pad 7 of FIG. 1 is driven by an output buffer comprising the PMOS transistor 8 and the NMOS transistor 9, which are respectively pull-up and pull-down transistors to the VDD and VSS supplies. The gates of the NMOS and PMOS transistors 8 and 9 are driven by the CUT 13. Input pad 6 has a pull-up resistor 11 to VDD and drives into the CUT 13. Similarly, input pad 10 has a pull-down resistor 12 to VSS and drives into the CUT 13. Significantly, resistors 11, 12 and 18, output buffer 17, and output buffer formed by transistors 8 and 9 are commonly found devices associated with input and output pads.

FIG. 2 shows the circuit of FIG. 1 being connected to a tester to measure IDDQ. As shown in Figure 2, VSS pads 4, 5 are connected directly to the tester ground 20. VDD pads 2, 3 are both connected to the tester input channel 26, a sense resistor 21, relay 25 and decoupling (or bypass) capacitor 22. During normal functional testing, relay 25 is closed, making a low-impedance connection to the tester power supply 23 (i.e. resistor 21 is shunted). However, during IDDQ testing, relay 25 is opened, forcing the current to flow through sense resistor 21. When the CUT 13 switches, however, the sense resistor 21 is often too large to provide the current necessary to operate CUT 13. A bypass capacitor 22 must therefore be used to supply the necessary operating current during switching. This bypass capacitor 22 is selected to be at least an order of magnitude greater than the sum total of the capacitance on the IC and driven by the IC. For example, if all the switching circuits, including the output buffers, must drive a total of 0.05 uF, then the decoupling capacitor 22 should be at least 0.5 uF. If this 10:1 ratio is used, the worst case "voltage droop" at the VDD pads would be 0.5 V in a circuit using a 5.0 volt power supply. The quiescent current after switching is measured at test channel 26 (input to a tester) by the voltage drop across the sense resistor 21. In this configuration, a tester channel 26 is dedicated to measure the IDD current.

The operating speed of such a measurement system is determined by the relative sizes of the sense resistor (R) 21, the decoupling capacitor (C) 22, the maximum permissible "voltage droop", and the resolution of the voltage measurement system. For example, if the test channel 26 is a standard tester input logic channel, it might be decided that it is reasonable to make a measurement with an accuracy of better than 100 mV. This would then be VDD-0.1 volts, or 4.9 V, on a 5.0 V circuit. If the maximum "voltage droop" permissible is 0.5 V, then the current through resistor 21 must have sufficient time to restore the voltage on decoupling capacitor 22 to at least 4.9 V on the worst case "good" circuit before quiescent current for each test vector can be measured. In this example, if we consider a current measuring in excess of 100 uA through sense resistor 21 as indicative of a "bad" circuit, we need a resistor value of about 1 k ohms to detect the 100 uA as a voltage difference of 0.1 volts across the resistor. Assuming the good circuit draws less than 1 uA, then the time to charge decoupling capacitor 22 from 4.5 V to 4.9 V is about 1.6 RC ($=1.6 \times 1,000 \times 0.5 \times 10^{-6}$), or 0.8 milliseconds. For a test using 10,000 test vectors, the total test time required would be at least 8 seconds, which is barely acceptable. However, for a test using 100,000 test vectors, the total test time would be an unacceptable 80 seconds.

This method, therefore, is only suitable when either (i) the circuit is to be tested with only a small number of test vectors;, (ii) the circuit has little capacitive loading, or (iii) when a small sense resistor can be used, such as when only defects causing large currents are to be detected.

Practical compromises between accuracy and testing speed must often be made. If the charge on the decoupling capacitor 22 can be supplied through an independent low-impedance source that could be quickly disconnected from the circuit after the circuit switches, test performance would be significantly enhanced. The relay 25 is not adequate for this as relay response times are typically in the millisecond range.

In the reference above, Keating describes having a sense resistor bypassed by a field effect transistor (FET) switch rather than a relay. This technique is illustrated in FIG. 2, which shows as an alternative to relay 25 FET 24 (enclosed in dotted lines) connected across sense resistor 21. Note that because the large decoupling capacitor 22 is needed, Keating does not expect to integrate into the IC under test this IDDQ circuit, which includes FET 24, sense resistor 21, and capacitor 22. Such per se integration is also undesirable because the FET 24 and the sense resistor 21 will each be in series with the VDD bus of the IC, such that their individual impedance will be affecting the speed and power performance of the circuit during functional operation.

Another approach, called "Built-in current (BIC) testing" has been proposed. Under this approach, a special on-chip circuit is used to provide a virtual ground potential to which the rest of the IC is grounded. Current is measured as it flows from the circuit through the virtual ground to the real ground. This procedure and a circuit implementing this procedure are described in "Built-In Current Testing-Feasibility Study" by W. Maly and P. Nigh, Proc. Int'l Conference on Computer Aided Design 1988, pp 340–343. This technique improves the testing speed since the current is measured by an on-chip circuit rather than using an external circuit. However, the circuit described by Maly and Nigh does not provide a quality ground signal. Thus, the performance of the IC suffers because of test purposes. Generally, this is an unacceptable compromise.

Ideally, on-chip circuitry should be used for IDDQ testing without trading-off accuracy and test speed. The BIC technique proposed by Maly above, for example, is unsatisfactory because bus lines in an integrated circuit using the BIC technique are required to be actively driven, thereby causing undue performance degradation during normal use.

SUMMARY OF THE INVENTION

The present invention provides various apparatus and methods for performing IDDQ testing using the input and output circuits typically associated with input and output pads of an integrated circuit. In accordance with the present invention, the number of tester channels and external circuit elements necessary for IDDQ measurements are minimized.

In one embodiment of the present invention, the IDDQ current is measured by sensing the voltage at either an input pad or an output pad, thereby eliminating one tester channel previously dedicated to IDDQ testing.

In another embodiment of the present invention, an internal pull-up transistor of known resistance is used for current sensing, thereby eliminating the external sensing resistor.

In accordance with another embodiment of the present invention, a method and apparatus for performing IDDQ testing quickly are provided by disconnecting the primary power or ground bus line connections from the tester and using alternate connections to provide power to the circuit under test over the duration of the IDDQ testing.

In one embodiment, the primary supply connection to VDD is disconnected from the primary tester power supply and connected to a conventional tester pin driver which is then used to restore the VDD voltage of a decoupling capacitor after switching and prior to making the IDDQ measurement.

A further benefit using these alternate connections is a practical method for performing built-in-current testing.

BRIEF DESCRIPTION OF THE INVENTION

Figure 3:
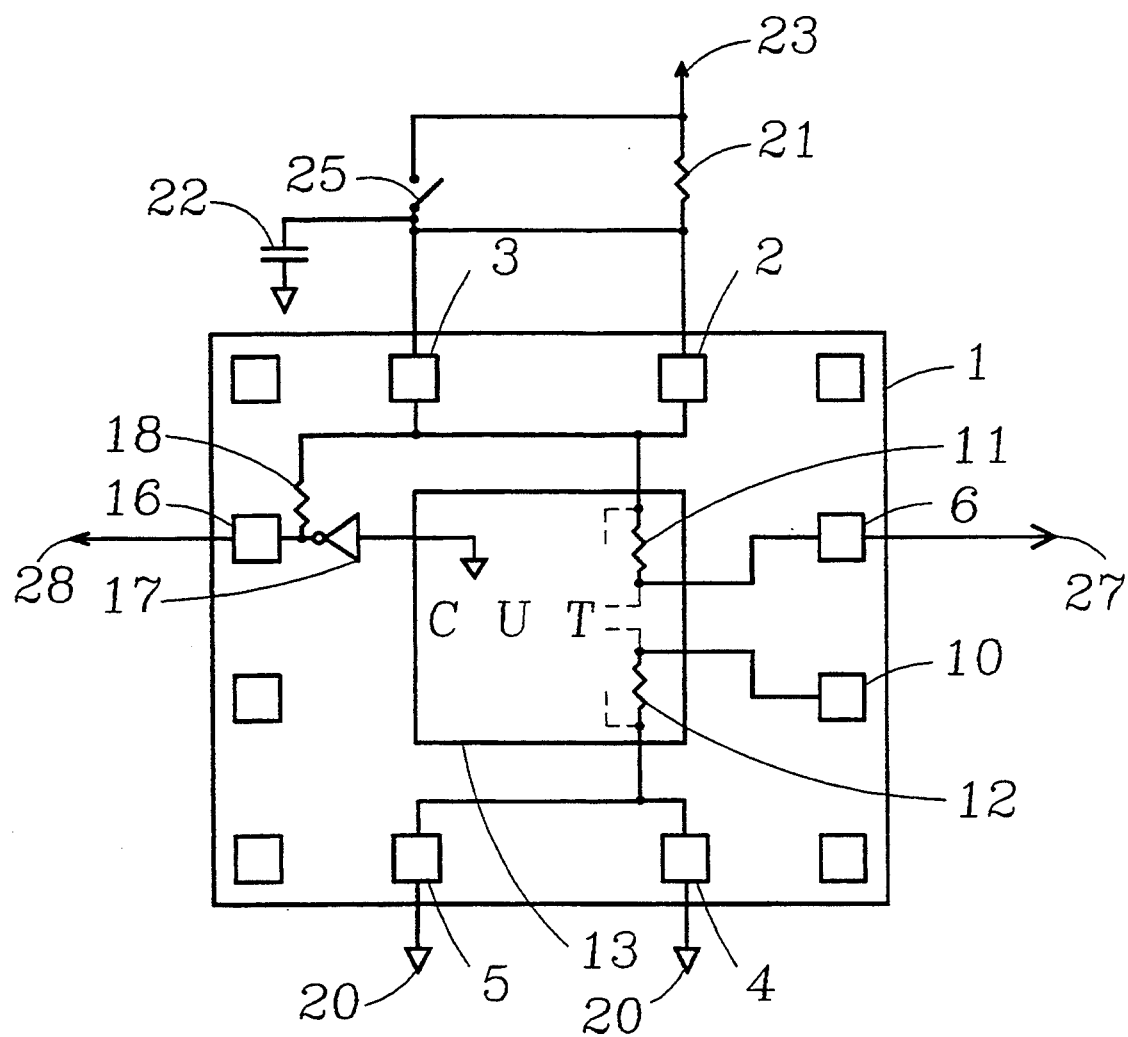

FIG. 3 shows a sense resistor 21 connected to the VDD terminal of an IC with voltage drop across the sense resistor 21 measurable from either connection pads 6 or 16, in accordance with the present invention.

Figure 4:
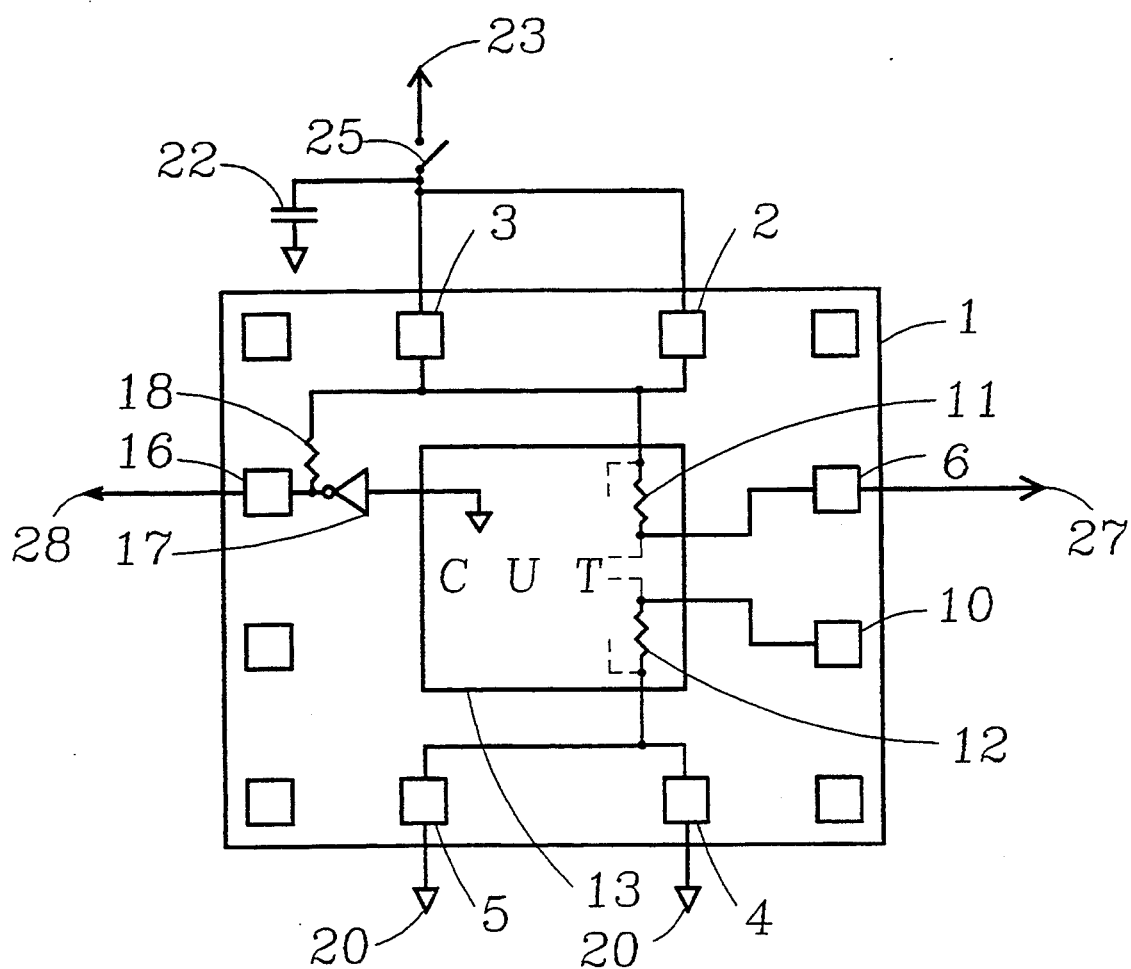

FIG. 4 shows the use of on-chip resistors 11 or 18 to measure IDDQ, in accordance with the present invention.

Figure 5:
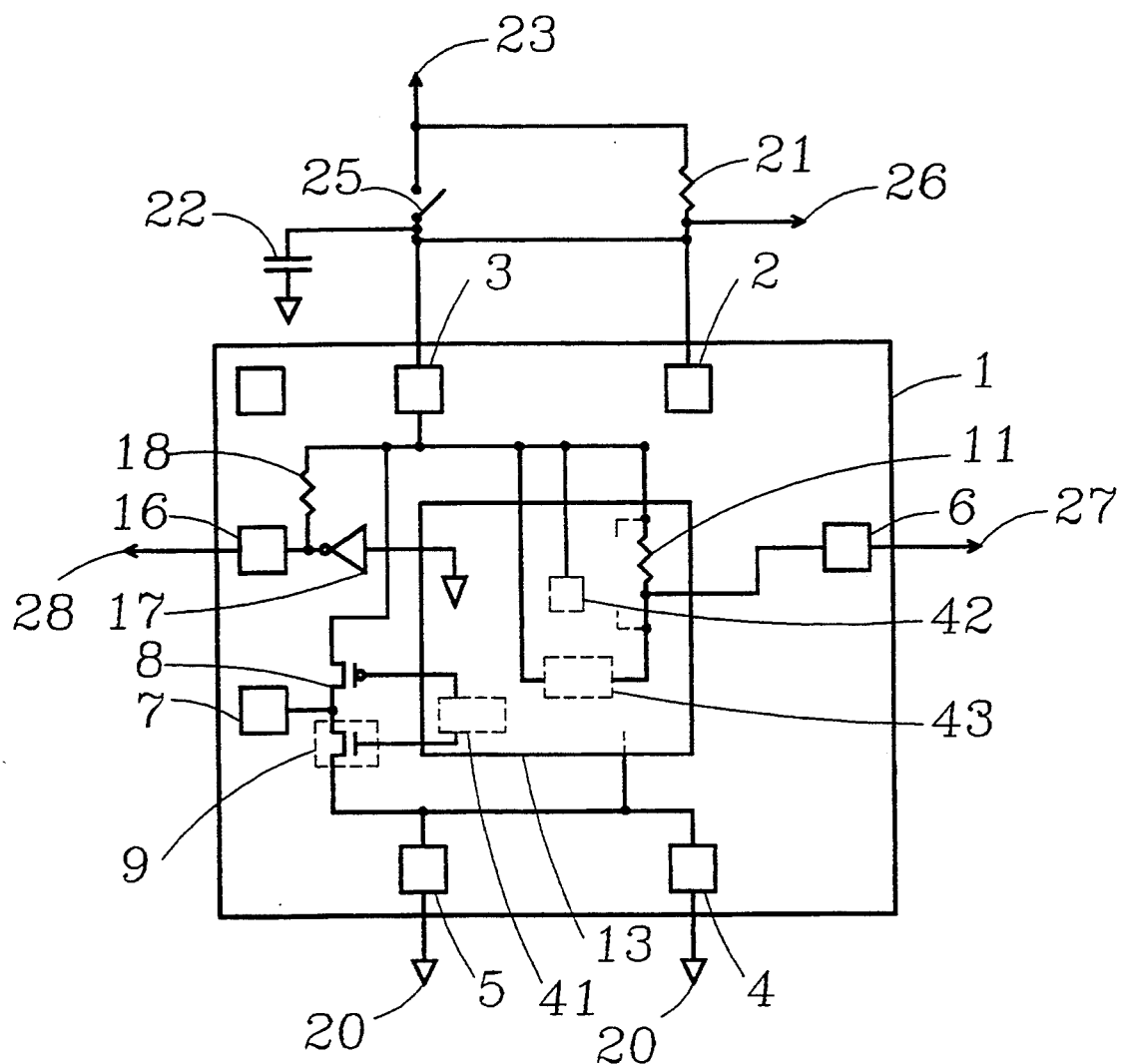

FIG. 5 shows an IC configured to measure IDDQ using output buffer means, in accordance with the present invention.

Figure 6:
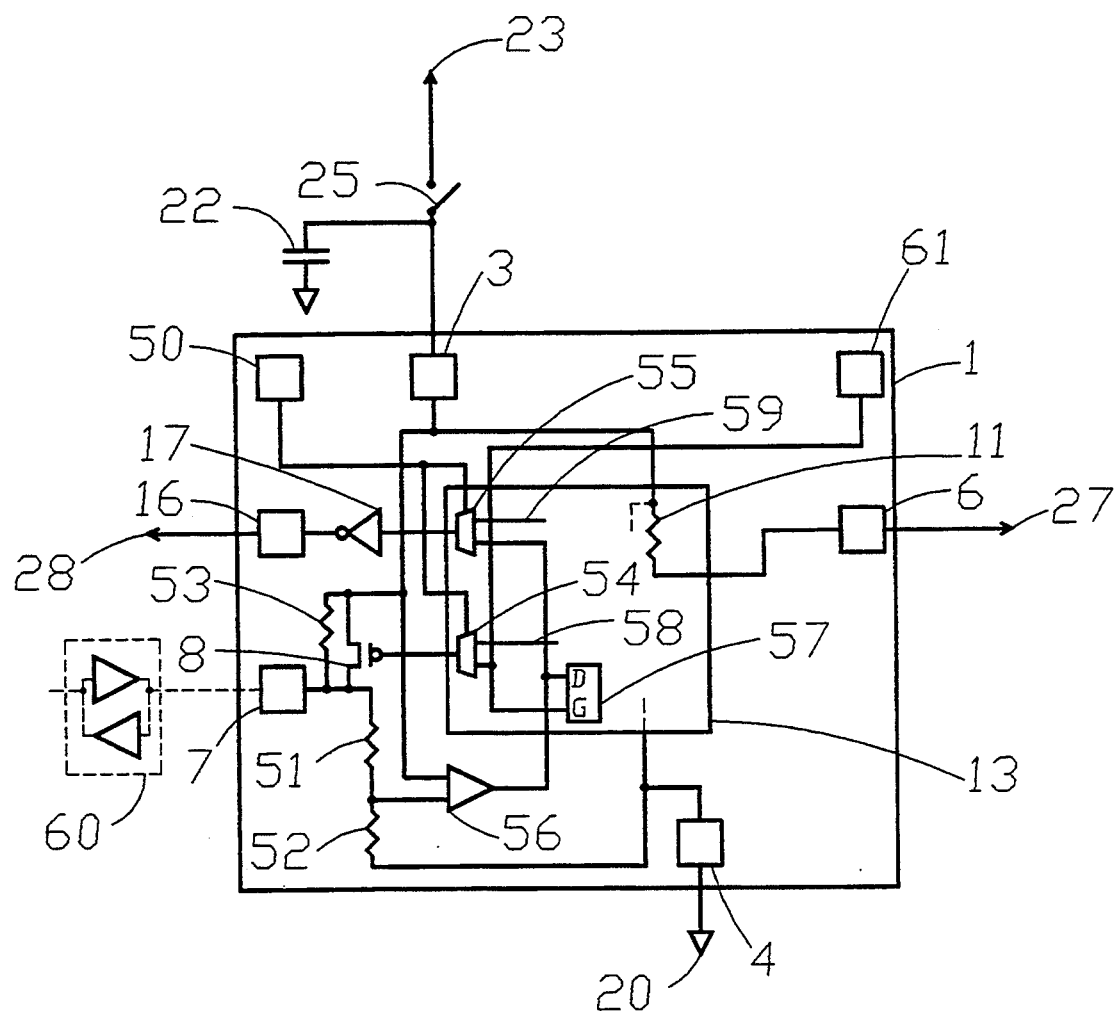

FIG. 6 shows an apparatus in accordance with the present invention.

DETAILED DESCRIPTION OF THE INVENTION

This invention describes several related methods and apparatus to measure the current drawn (IDDQ) by an IC without using extra parametric measurement units of a tester. These apparatus and methods use either external components and external voltage measurements, or internal IC components and voltage measurements. During the measurements in accordance with the present invention, the primary power or ground pads of the IC are disconnected and current is supplied through external circuit element or through existing connection pads other than the primary power supply pads.

Figure 1:
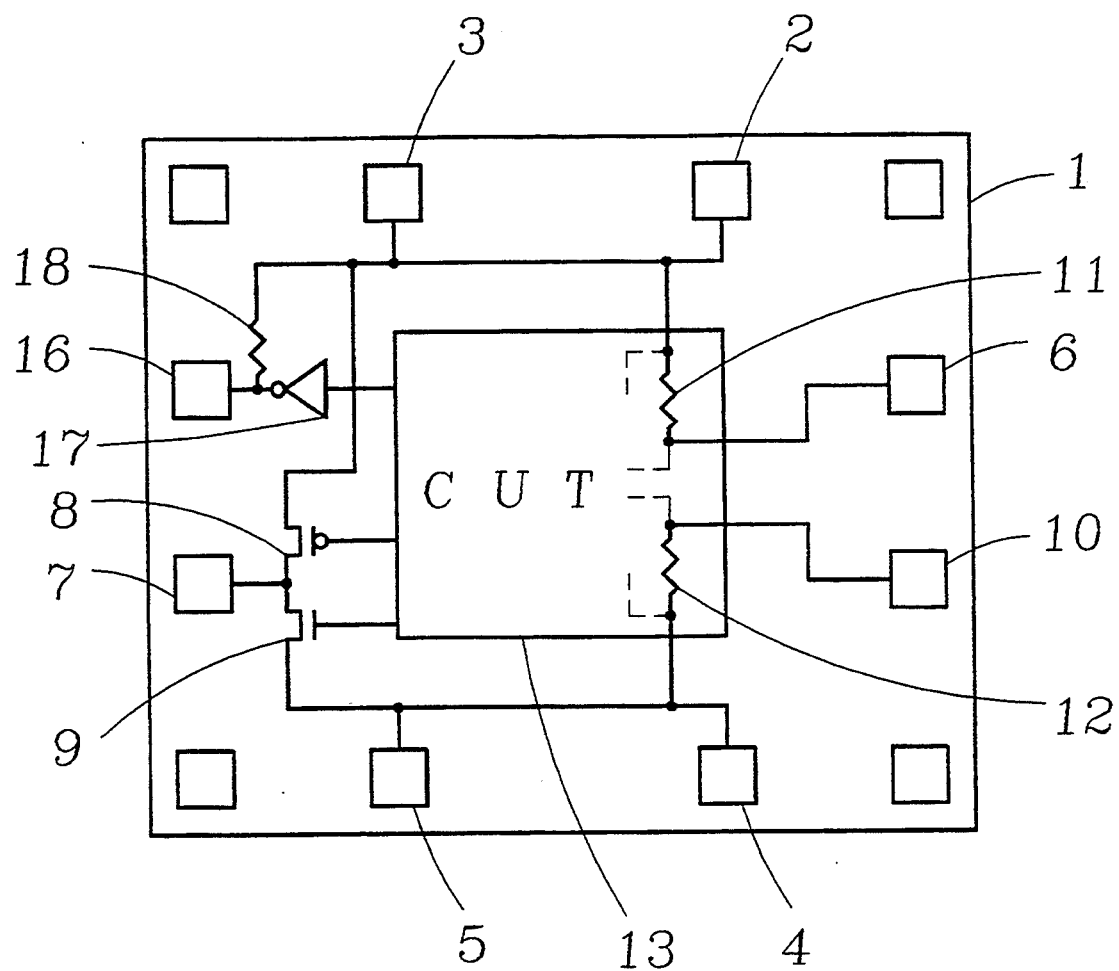
FIG. 1 shows a simplified schematic of an IC illustrating various I/O configurations.
Figure 2:
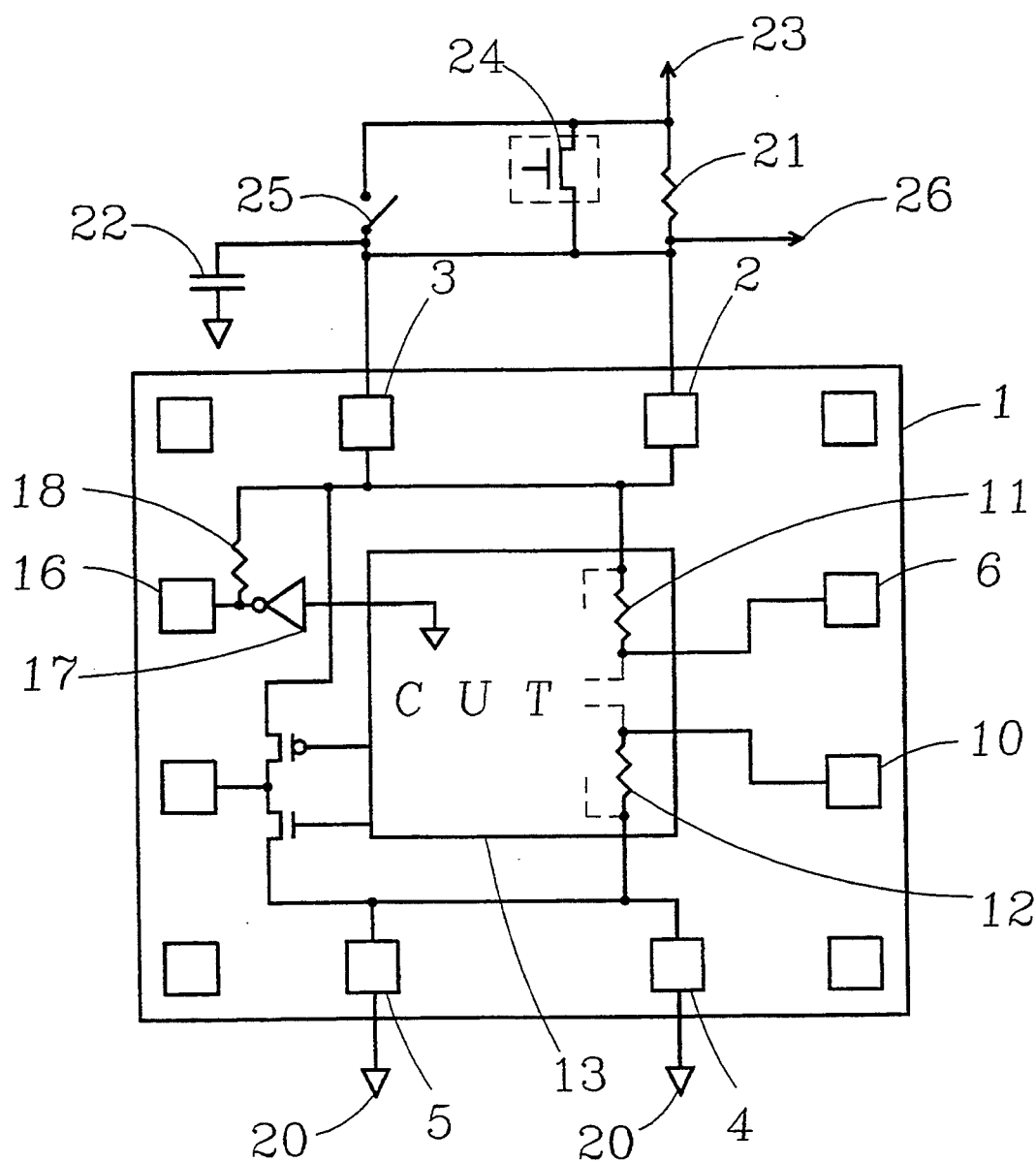
FIG. 2 shows a sense resistor 21 connected to the VDD terminal of an IC so as to measure current, in the prior art.

In accordance with the present invention, a variation of the technique illustrated in FIGS. 1 and 2 is provided in FIG. 3 by detecting the voltage drop across the sense resistor 21 through one of alternative tester channels 28 and 27, which are respectively connected to an output pad 16 and an input pad 6. As shown in FIG. 3, instead of using tester channel 26 as in the voltage measurement of FIG. 2, voltage across sense resistor 21 may be measured by using another tester channel 27 at input pad 6 where a pull-up resistor 11 (passive pull-up) connects input pad 6 with the power supply. If the electrical node at input pad 6 is floating, the voltage sensed at tester channel 27 is the voltage provided at tester channel 23 less the voltage drop across sense resistor 21. Alternatively, voltage across sense resistor 21 can also be measured using another tester input channel 28 at output pad 16, which is internally driven by inverting buffer 17 (active pull-up), or by pull-up resistor 18 to the IC's internal VDD bus (passive pull-up). In this example, if inverting buffer 17 is used, one must ensure a valid high output level at the output lead of invertor buffer 17. This is illustrated in FIG. 3 by driving the input lead of the inverting buffer 17 to ground, so that the voltage at the output pad 16 is driven to the IC's internal supply voltage provided through primary power supply pad 2. Alternatively, if the pull-up resistor 18 is used, i.e. the inverting buffer 17 is put into high-impedance state, the voltage at input channel 28 can be measured in a manner identical to the voltage measurement at input channel 27. Because both tester channels 28 and 27 are used for functional testing, as well as the switching phase of IDDQ testing, no additional tester channel., such as tester channel 26, is needed to provide IDDQ testing under this method. By contrast, in the method illustrated in FIG. 2, tester channel 26 is used in neither functional testing nor the switching phase of IDDQ testing, since pads 2 and 3 are primary power supply pads.

Significantly, IDDQ measurements using passive pull-down resistors or active pull-down can be symmetrically provided, such that the measurements are made in reference to VSS (the "ground" reference) instead of the "power" voltage reference VDD. One of ordinary skill in the art will be able to provide the circuit connections for such IDDQ measurements, upon consideration of the above description and FIG. 3.

In accordance with another embodiment of the present invention illustrated in FIG. 4, the external sense resistor 21 is eliminated from the IDDQ measurement. In this IDDQ measurement, power is supplied to the circuit CUT 13 via the pull-up resistor 11 of known resistance, using the normal tester pin driver channel 27, which is connected to input pad 6. The voltage drop across the pull-up resistor 11 can be measured at output pad 16, using either pull-up resistor 18 or inverting buffer 17, which input lead is driven to ground voltage. Alternatively, if the resistance of resistor 18 is known, and the output buffer 17 can assume a high impedance state, resistor 18 can be used to sense the IDDQ current. In this instance, power is supplied via output pad 16 by tester channel 28 and the output buffer 17 is put into high impedance state. The voltage drop across resistor 18 is measured by sensing the voltage at input pad 6 using tester channel 27. Hence, under this embodiment, two input or output pads with pull-up resistors are used for IDDQ measurement, one of the input or output pads being the power supply point for the quiescent phase of IDDQ testing.

In this embodiment, the relay 25 and decoupling capacitor 22 are still required and are connected to the primary power supply pads 2 and 3. As discussed above, the relay 25 supplies power for tests other than IDDQ. The decoupling capacitor 22, also described above, provides the switching current when relay 25 is open during the switching phase of the IDDQ testing to limit "voltage droop."

In accordance with another embodiment of the present invention, a practical method avoiding the performance tradeoff in a BIC circuit is provided by disconnecting the primary power supply connecting points (VDD pads) during IDDQ testing, in conjunction with using other pads to supply current and to measure IDD. This embodiment is shown in FIG. 5. In this embodiment, for the switching phase of IDDQ testing only, power is supplied via output pad 7. Because power is supplied by a path other than via the primary power supply pads 2 and 3 used in the IC's functional operation, neither the sense resistor nor the bypass low-impedance transistor is in series during functional operation with the power supply pads and the VDD supply. As a result, the sense resistor and the bypass low-impedance transistor affect the operation of the IC only under IDDQ testing. The integration of both the sense resistor and the low-impedance transistor switch to the bypass capacitor is therefore possible, without affecting the power and speed performance of the circuit during functional operation.

As shown in FIG. 5, relay 25 is open during IDDQ testing. During the switching phase of the IDDQ testing, as explained above, decoupling capacitor 22 provides voltage regulation. But instead of charging the decoupling capacitor 22 through a fixed sense resistor, such as sense resistor 21, the decoupling capacitor 22 is charged through a low-impedance transistor 8, which is turned on during the switching phase of IDDQ testing in order to bypass the sense resistor 21. Low-impedance transistor 8 can be a dedicated transistor used exclusively for supplying power during the switching phase of the IDDQ testing, or more efficiently, transistor 8 is the pull-up transistor of an existing output buffer, such as transistor 8 of an existing output buffer formed by transistors 8 and 9. Control means 41 is needed to operate transistor 8 (and if present, transistor 9 also), to turn it on during the switching phase of IDDQ testing and to turn it off during the current measurement (i.e. quiescent) phase of IDDQ testing.

Alternatively, capacitor 22 can be recharged by tester pin driver 26. Note that the tester pin driver 26 will typically be a bi-directional pin driver capable of driving as well as receiving. Pin drivers are not used as the power supply source on a tester to supply the VDD or VSS power to an IC during test because the impedance of a pin driver is too high and the current the pin driver able to supply too small to be used as a well-regulated voltage for functional testing. However, a pin driver is capable of charging capacitor 22 back to the proper VDD voltage after it is partially discharged by the switching transients described above. This particular use of a pin driver has heretofore never been described.

After recharging the capacitor, the pin driver forcing function is disabled. The VDD voltage can then be measured by either tester channel 26 in its receiver mode or, at another pad on the IC by a different tester channel. As a tester pin driver generally has a higher impedance and/or lower current drive capabilities than the primary tester power supply, it may be necessary to operate the IC at a frequency lower than normal to allow time for the capacitor time to fully charge.

It will be appreciated also that buffer 17, when set to high-output state (such as shown in FIG. 5) can be used to charge decoupling capacitor 22 also. Buffer 17, when so used, should be put into high-impedance state during the measurement phase of IDDQ testing. A mechanism such as control means 41, can be used for putting buffer into a high-impedance state.

Depending on the power supply used during the measurement phase of IDDQ testing, the sense resistor can be either external resistor 21, when power is supplied through the tester drive channel 23, or an internal component, such as pull-up resistor 11, when power is supplied by tester pin driver channel 27. When external resistor 21 is used, the voltage drop across sense resistor 21 can be measured at channel 26, 27 or 28, respectively connected to primary power pads 2 and 3, input pad 6 and output pad 16, in the same manner as described in the embodiments described above. When an internal resistor (e.g. resistor 11 or resistor 18) is used, power can be supplied at tester channel 28, and the voltage on the VDD bus measured at channel 27 at input pad 6, or power can be supplied at tester channel 27 and the voltage on the VDD bus measured at channel 28 at output pad 16, in the same manner described in the embodiments above. When an internal resistor is used, the power supply at pads 2 and 3 by tester channel 23 should be disconnected.

Note that when a tester channel or other driver circuit which can be put into a high-impedance state is used for charging decoupling capacitor 22 through low-impedance transistor 8 or buffer 17, in the manner described above, it is not necessary to turn off transistor 8 or buffer 17. Instead, the tester channel or the other driver circuit should be put into a high-impedance state. Under this arrangement, control means 41 which is used to turn off transistor 8 or buffer 17 can be eliminated. As can be readily seen, it is also possible to use other output pads for charging decoupling capacitor 2, if the selected output pad is in the high output drive state. In fact, it is possible to use different output pads at different times. If, for every IDDQ test, at least one output pad is in its high output drive state by virtue of its functional operation, such output pad can be used to charge decoupling capacitor 22. In that situation, control means 41 can be completely eliminated.

FIG. 5 also shows a sensing means 42, which can also provide a voltage measurement of the VDD bus on-chip. Sensing means 42, for example, can be a comparator having a built-in reference voltage. In such a sensing means, when the built-in reference voltage is exceeded, i.e. a large drop is seen across sensing resistor 11, when power is supplied at input pad 6 through tester channel 27, a defective condition is signalled.

Alternatively, as shown in FIG. 5 also, sensing means 42 and sensing resistor 11 can be replaced by a current supply and sensing means 43. The virtual ground circuit proposed by Maly and Nigh discussed in the above in conjunction with BIC testing is one circuit which can be used for this purpose. Since power is supplied through the primary power supply pads during normal operation, a current supply and sensing means, such as current supply and sensing means 43, which is not in the power supply path during normal operation, does not affect the normal operation of the IC.

During IDDQ testing, however, the primary power supply pads are disconnected and power is supplied through the current supply and sensing means 43 in accordance with the present invention. Therefore, under this arrangement, current supply and sensing means 43 affect the IC only during IDDQ testing, thereby overcoming the disadvantages of Maly and Nigh's approach recited in the above. In this configuration also, the results of the current measurement can be monitored directly at pad 6, or be stored for later retrieval.

FIG. 6 shows a simplified circuit illustrating another embodiment which performs IDDQ testing using IC pads other than the VDD pads for supplying and sensing the quiescent current drawn by the IC, and using components built into the IC. In order to facilitate reference, the components of FIG. 6 follow the same numbering convention as used in FIGS. 1-5 above. The components having the same reference numbers shown in FIGS. 1-6 are identical. In this embodiment, multiplexor 54 controls transistor 8, which is used to charge external capacitor 22 for limiting voltage drop during the switching phase of IDDQ testing. Multiplexor 54 allows control input signal 61 to control transistor 8 regardless of the state of signal 58, which inverse is the normal output signal at pad 7 of the CUT 13 under functional operation. Test enable signal 50 is connected to the select inputs of the multiplexors 54 and 55, to select the transmitted test output signals during IDDQ test. Although shown as direct input signals to the IC, test enable signal 50 and control signal 61 can also be derived from other signals. Although sense resistor 53 for sensing IDDQ current is shown in FIG. 6 as a dedicated sense resistor, as discussed in the embodiments above, pull-up resistor 11 or any other pull-up resistor can be used as the sense resistor. For example, if pull-up resistor 11 is used, tester channel 27 can be used to supply power through input pad 6 to the IC during IDDQ testing.

Alternatively, in place of sense resistor 53 can be a resistive FET, which gate can be controlled, for example, by the control signal 61. Comparator 56, and resistors 51 and 52 form a sensing means 42, which can be used to detect an abnormal voltage on the VDD bus. The output signal of comparator 56 can be directed to an output pad 16 via multiplexor 55 for output tester channel 28, or be stored in latch 57 for later analysis.

Also shown in FIG. 6 is a typical tester channel bi-directional pin driver 60. This pin driver 60 can be used to measure the output state during functional test operation, and to drive the pin to the VDD voltage during IDDQ testing.

Further, the signals used for timing and control in the embodiment of FIG. 6 can be derived from dedicated pins or, more economically, be derived from multipurpose pins. For example, in addition to operating multiplexors 54 and 55, test enable pin 50 can also be used to multiplex another functional pin between being an input pin during normal operation and being an input pin for the test control signal 61 during IDDQ testing.

Dedicated test pins or a test bus such as the IEEE Std. 1149.1 is another efficient means to provide test control signals for IDDQ testing. Registers defined for test purposes can also be used for storage of the voltage detected by a voltage comparator, such as comparator 56 of FIG. 6. For example, the instruction register bits defined in IEEE Std. 1149.1 can replace the control and timing pins 50 and 61. It should be seen at this point that, in accordance with the present invention, the IDDQ test can actually be performed using components otherwise already available at the dedicated test pins. For example, transistor 8 can be part of the test bus output buffer by using pad 7 as the test bus output pad. Similarly, pad 6 can be an input pin of the test bus with resistor 11 as the test bus pull-up. In this fashion, there would be no potential impact upon performance of the circuit under functional conditions, as no additional circuitry is connected to non-test pins.

Any of the IDD measurements described above can be made without the use of a sense resistor, by making the measurement at a fixed time after the decoupling capacitor has been fully charged and the charging current disengaged. The capacitor discharges at a known rate based on the equation $i = C\, dv/dt$, where i is IDD, C is the capacitance of the decoupling capacitor and $dv/dt$ is the rate of change in the voltage of the decoupling capacitor with time. By measuring the voltage on the capacitor using any of the methods described herein at a fixed time interval after disengaging the discharging current, the IDD current can be determined. This method has the advantage of eliminating the sense resistor, and being able to adjust the sensitivity of the measurement by simply changing the time at which the voltage measurement is made. The disadvantage of this method is a less accurate measurement because of parasitic capacitors and the inherent inaccuracy of a time-dependent measurement.

The detailed description and the accompanying figures provided above are intended to illustrate specific embodiments of the present invention and are not intended to limit the present invention. Numerous modifications and variations are possible within the scope of the present invention, as defined by the following claims.

I claim:

1. A method for measuring current in an integrated circuit having a plurality of connection pads, said plurality of connection pads including a first primary supply pad for connection to a first supply voltage source and a second primary supply pad for connection to a second supply voltage source, said first and second primary supply pads providing a path for supplying power to said integrated circuit, said method comprising the steps of:

connecting a means for sensing current between said first primary supply pad and said first supply voltage source;

selecting one of said plurality of connection pads other than said first and second primary supply pads, so as to provide a selected connection pad having the same voltage as the voltage of said first primary supply pad; and measuring the voltage at said selected connection pad, said voltage being indicative of the current in said means for sensing current.

2. A method for measuring current in an integrated circuit as in claim 1, wherein said first supply voltage source is power and said second supply voltage source is ground.

3. A method for measuring current in an integrated circuit as in claim 1, wherein said first supply voltage source is ground and said second supply voltage source is power.

4. A method for measuring current in an integrated circuit having a plurality of connection pads, said plurality of connection pads including a first primary supply pad for connection to a first supply voltage source and a second primary supply pad for connection to a second supply voltage source, said first and second primary supply pads providing a path for supplying power to said integrated circuit, said method comprising the steps of:

selecting one of said plurality of connection pads other than said first and second primary supply pads, so as to provide a first selected connection pad connected to said first primary supply pad through a means for sensing current, said means for sensing current in said integrated circuit;

attaching said first supply voltage source to said first selected connection pad; and measuring the voltage attained by said first primary supply pad, said voltage being indicative of the current in said means for sensing current.

5. A method for measuring current in an integrated circuit as in claim 4, wherein said step of measuring the voltage attained by said first primary supply pad comprises the steps of:

selecting a connection pad from said plurality of connection pads other than said first selected connection pad and said first and second primary supply pads so as to provide a second selected connection pad connected in such a manner as to attain the voltage of said first primary supply pad; and measuring voltage at said second selected connection pad.

6. A method for measuring current in an integrated circuit as in claim 5, wherein at least one of said first and second selected connection pads are dedicated for testing purposes.

7. A method for measuring current in an integrated circuit as in claim 4, wherein said first supply voltage source is power and said second supply voltage source is ground.

8. A method for measuring current in an integrated circuit as in claim 4, wherein said first supply voltage source is ground and said second supply voltage source is power.

9. A method for measuring current in an integrated circuit as in claim 4, said method further comprising the step of providing means, connected to said first supply voltage source and said first primary supply pad, for selectably providing a current path from said first supply voltage source to said first primary supply pad.

10. A method for measuring current in an integrated circuit as in claim 9, wherein said means for selectably providing a current path comprises a transistor controlled by a test control signal.

11. A method of measuring current in an integrated circuit as in claim 9, wherein the current in said current path is provided by external source of current selectable between a current-providing state and a high-impedance state.

12. A method for measuring current in an integrated circuit as in claim 9, wherein said means for selectably providing a current path comprises at least one output circuit driven during functional operation to an output voltage substantially equal to the voltage of said first supply voltage source.

13. A method for measuring current in an integrated circuit as in claim 4, wherein said means for sensing current comprises a resistor.

14. A method for measuring current in an integrated circuit as in claim 4, wherein said means for sensing current comprises a transistor.

15. A method for measuring current in an integrated circuit as in claim 4, wherein said means for sensing current comprises a transistor controlled by a test control signal.

16. A method for measuring current in an integrated circuit as in claim 4, wherein said method further comprises the step of providing means for sensing a voltage in said integrated circuit for sensing a voltage drop across said means for sensing a current.

17. A method as in claim 4 wherein said measuring step is controlled by test control signals of a test bus.

18. A method for measuring current in an integrated circuit as in claim 4, wherein said measuring step measures current supplied to said integrated circuit through said first connection pad.

19. A method for measuring current in an integrated circuit as in claim 18, further comprising the step of transmitting the result of said current measurement to a connection pad other than said first connection pad.

20. A structure for measuring current in an integrated circuit having a plurality of connection pads, said plurality of connection pads including a first primary supply pad for connection to a first supply voltage source, a second primary supply pad for connection to a second supply voltage source, a first connection pad and a second connection pad, said first and second primary supply pads providing a path for supplying power to said integrated circuit, said structure comprising:
  means in said integrated circuit connected between said first connection pad and said first primary supply pad for sensing a current between said first connection pad and said primary supply pad; and
  means for transmitting to said second connection pad the voltage on said first primary supply pad, when said first primary supply pad is disconnected from said first supply voltage source, said voltage being indicative of the size of said current.

21. A structure as in claim 20, wherein said first voltage source is power and said second voltage source is ground.

22. A structure as in claim 20, wherein said first voltage source is ground and said second voltage source is power.

23. A structure as in claim 20, further comprising means in said integrated circuit for selectably providing a current path from said first connection pad to said first primary supply pad.

24. A structure as in claim 23, wherein said means for selectably providing a current path comprises a transistor controlled by a test control signal.

25. A structure as in claim 23, wherein the current in said current path is provided by an external source of current selectable between a current-providing state and a high-impedance state.

26. A structure as in claim 23, wherein said means for selectably providing a current path comprises an output circuit driven during functional operation to an output voltage substantially equal to the voltage of said first supply voltage source.

27. A structure as in claim 20, wherein said means for sensing a current comprises a transistor.

28. A structure as in claim 20, wherein said means for sensing a current comprises a resistor.

29. A structure as in claim 20, wherein said means for sensing a current comprises a transistor controlled by a test signal.

30. A structure as in claim 20, further comprising means in said integrated circuit for sensing a voltage drop across said means for sensing a current.

31. A structure as in claim 30, wherein said means for sensing a voltage drop comprises a voltage comparator.

32. A method for measuring current in an integrated circuit having a plurality of connection pads, said plurality of connection pads including a first primary supply pad for connection to a first supply voltage source, a second primary supply pad for connection to a second supply voltage source, said first and second primary supply pads providing a path for supplying power to said integrated circuit, said integrated circuit further including a circuit for selectively providing a low-impedance current source from said first primary supply pad to a selected one of said connection pads other than said first and second primary supply pads, said method comprising the steps of:
  connecting a means for sensing current between said first primary supply pad and said first supply voltage source;
  connecting said selected one of said connection pads to said first supply voltage source and enabling said selectable low-impedance current source;
  disabling said selectable low-impedance current source; and
  measuring the voltage of said first primary supply pad, said voltage being indicative of the current in said means for sensing current.

33. A method as in claim 32, wherein said first voltage source is power and said second voltage source is ground.

34. A method for measuring current in an integrated circuit having a plurality of connection pads, said connection pads including a first primary supply pad for connection to a first supply voltage source and a second primary supply pad for connection to a second supply voltage source, said first and second primary supply pads providing path for supplying power to said integrated circuit, said method comprising the steps of:
  connecting a decoupling capacitor between said first primary supply pad and said second supply voltage source;
  connecting a sensing resistor for conducting a current between said first supply voltage source and said first primary supply pad;
  connecting a tester pin driver set to forcing mode to charge said decoupling capacitor to the voltage of said first supply voltage source;
  disabling said forcing mode of said tester pin driver; and
  measuring the voltage attained at said first primary supply pad, said voltage being indicative of the current in said sensing resistor.

35. A method as in claim 34, wherein said measuring step measures the voltage of said first primary supply pad using aid tester pin set to sensing mode.

36. A method as in claim 34, wherein said measuring step measures the voltage at said first primary supply pad using a connection pad other than said first primary supply pad.

37. A structure for measuring current in an integrated circuit having a plurality of connection pads, said connection pads including a first primary supply pad for connection to a first supply voltage source and a second primary supply pad for connection to a second supply voltage source, said first and second primary supply pads providing a path for supplying power to said integrated circuit, said structure comprising:
- a decoupling capacitor between said first primary supply pad and said second supply voltage source;
- a sensing resistor for conducting a current between said first supply voltage source and said first primary supply pad;
- a tester pin driver capable of charging said decoupling capacitor to the voltage of said first supply voltage source; and
- means for measuring the voltage attained at said first primary supply pad, said voltage being indicative of the size of said current.

38. A structure as in claim 37, wherein said measuring means measures the voltage of said first primary supply pad using said tester pin driver set to sensing mode.

39. A structure as in claim 37, wherein said measuring means measures the voltage at said first primary supply pad using a connection pad other than said first primary supply pad.

40. A method for measuring current in an integrated circuit having a plurality of connection pads, said connection pads including a first primary supply pad for connection to a first supply voltage source, and a second primary supply pad for connection to a second supply voltage source, said first and second primary supply pads providing a path for supplying power to said integrated circuit, said method comprises the steps of:
- connecting a capacitor of known capacitance between said second supply voltage source and said first primary supply pad;
- charging said capacitor to the voltage of said first supply voltage source;
- disabling said charging step; and
- measuring, after a predetermined period of time from said disabling step, the voltages of said capacitor over a fixed time interval, said voltages being indicative of the current provided by said capacitor over said predetermined period of time.

41. A structure for measuring current in an integrated circuit having a plurality of connection pads, including a fist primary supply pad for connection to a first supply voltage source, and a second primary supply pad for connection to a second supply voltage source, said first and second primary supply pads providing a path for supplying power to said integrated circuit, said structure comprises:
- a capacitor of known capacitance connected between said second supply voltage source and said first primary supply pad;
- means for charging said capacitor to the voltage of said first supply voltage source;
- means for disabling said charging means; and
- means for measuring, after a predetermined period of time from said disabling of said charging means, the voltages of said capacitor over a fixed time interval, said voltages being indicative of the size of said current flowing during said predetermined period of time.

* * * * *